US012701686B2

(12) United States Patent
Tsuchida et al.

(10) Patent No.: US 12,701,686 B2
(45) Date of Patent: Aug. 4, 2026

(54) ELECTRONIC DEVICE WITH IMPROVED SHIELDING STRUCTURE

(71) Applicant: Sony Interactive Entertainment Inc., Tokyo (JP)

(72) Inventors: Shinya Tsuchida, Tokyo (JP); Katsushi Ito, Chiba (JP); Nobuyuki Sugawara, Chiba (JP); Tetsufumi Nozawa, Chiba (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 265 days.

(21) Appl. No.: 18/191,921

(22) Filed: Mar. 29, 2023

(65) Prior Publication Data

US 2023/0328940 A1 Oct. 12, 2023

(30) Foreign Application Priority Data

Apr. 11, 2022 (JP) ................................. 2022-065380

(51) Int. Cl.
*H05K 9/00* (2006.01)
*H05K 1/181* (2026.01)

(52) U.S. Cl.
CPC ........... *H05K 9/0032* (2013.01); *H05K 1/181* (2013.01); *H05K 2201/10371* (2013.01)

(58) Field of Classification Search
CPC ...... H05K 9/0033; H05K 9/00; H05K 9/0007; H05K 1/181; H05K 9/0032; H05K 2201/10371
See application file for complete search history.

(56) References Cited

U.S. PATENT DOCUMENTS

| 8,558,121 | B2 | 10/2013 | Tamaki |
| 10,932,356 | B2 | 2/2021 | Nozawa |

(Continued)

FOREIGN PATENT DOCUMENTS

| GB | 2 292 483 | * | 6/1994 | ............... H05K 9/00 |
| GB | 2292483 A | * | 6/1994 | ............... H05K 9/00 |

(Continued)

OTHER PUBLICATIONS

Extended European Search Report for corresponding EP Application No. 23165531.7, 25 pages, dated Sep. 13, 2023.

(Continued)

*Primary Examiner* — Imani N Hayman
*Assistant Examiner* — Ross Terry Mularski
(74) *Attorney, Agent, or Firm* — Kilpatrick Townsend & Stockton LLP

(57) ABSTRACT

Provided is an electronic device including a circuit board having a first surface and a second surface, a first member covering the first surface to function as a shield of the circuit board and having a first encompassing region having, in at least a portion thereof, a first outer region, and a second member that is placed on a side of the second surface that has a second outer region. One of the first and the second outer regions has at least one outer fixed portion fixed to another of the first and the second outer regions and at least one projection located away from the at least one outer fixed portion in a direction along an outer edge of the circuit board. The first and the second members are in contact with each other with the at least one outer fixed portion and the at least one projection.

16 Claims, 11 Drawing Sheets

(56)                    References Cited

U.S. PATENT DOCUMENTS

| | | | |
|---|---|---|---|
| 11,375,606 B2 | 6/2022 | Nozawa | |
| 2011/0226523 A1 | 9/2011 | Tamaki | |
| 2017/0290140 A1 | 10/2017 | Auger | |
| 2018/0255633 A1* | 9/2018 | Nozawa | H05K 1/0216 |
| 2021/0185864 A1 | 6/2021 | Yamazaki | |
| 2021/0298167 A1 | 9/2021 | Nozawa | |
| 2022/0009428 A1 | 1/2022 | Sumida | |
| 2023/0255009 A1 | 8/2023 | Takahashi | |

FOREIGN PATENT DOCUMENTS

| | | | |
|---|---|---|---|
| JP | 2009117421 A | 5/2009 |
| JP | 2010267927 A | 11/2010 |
| JP | 2011198861 A | 10/2011 |
| JP | 2012238813 A | 12/2012 |
| JP | 2013038243 A | 2/2013 |
| JP | 2018148026 A1 | 9/2018 |
| JP | 2021145047 A | 9/2021 |
| JP | 2021150517 A | 9/2021 |
| WO | 2022059263 A1 | 3/2022 |

OTHER PUBLICATIONS

Notice of Reasons for Refusal for corresponding JP Application No. 2022-065380, 7 pages, dated Mar. 6, 2024.

\* cited by examiner

F I G . 3 A
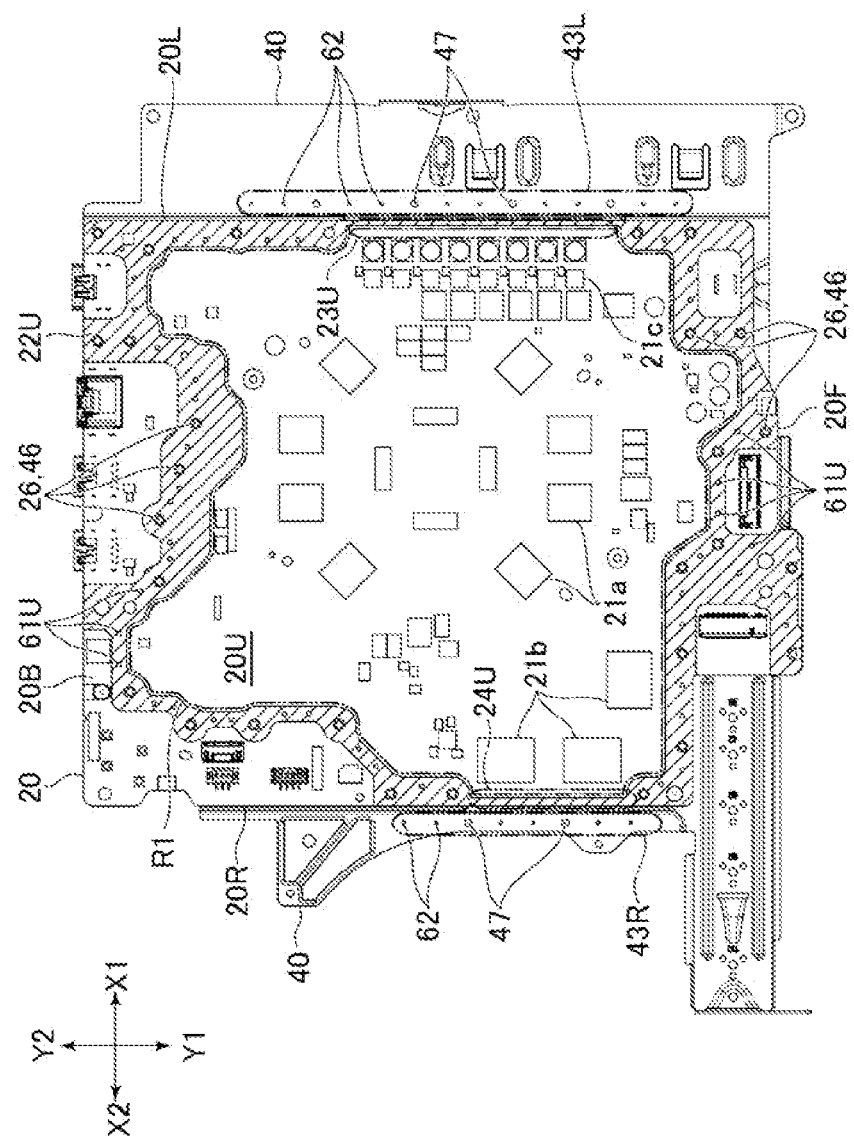

F I G . 5
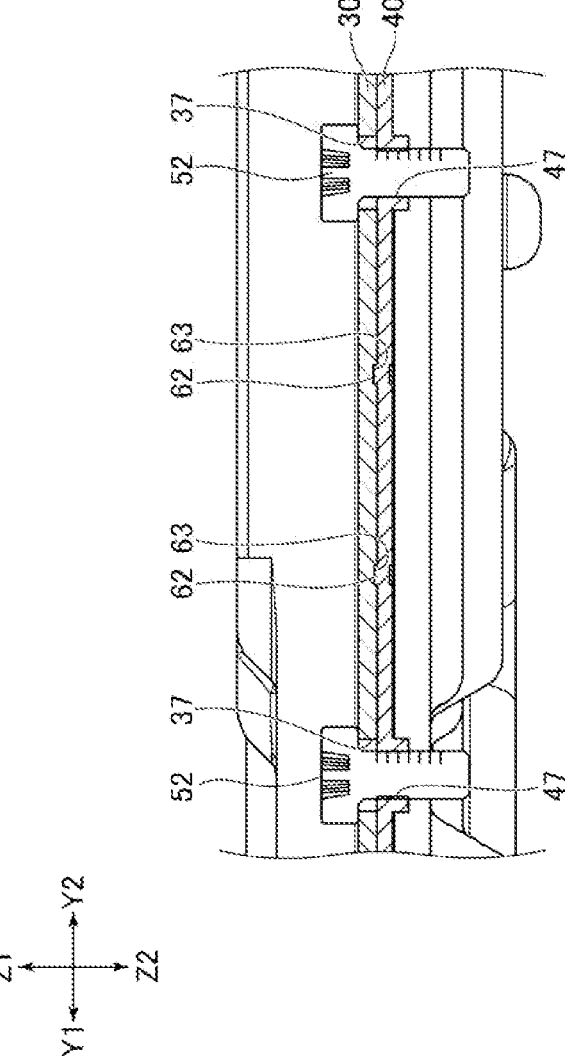

ELECTRONIC DEVICE WITH IMPROVED SHIELDING STRUCTURE

CROSS REFERENCE TO RELATED APPLICATION

This application claims the benefit of Japanese Priority Patent Application JP 2022-065380 filed Apr. 11, 2022, the entire contents of which are incorporated herein by reference.

BACKGROUND

The present disclosure relates to an electronic device.

Hitherto, in electronic devices, noise countermeasures (electro magnetic interference (EMI) countermeasures) for shielding noise radiated from chips or data transmission lines mounted on circuit boards have been taken. In an electronic device described in Japanese Patent Laid-open No. 2018-148026 (hereinafter, referred to as Patent Document 1), with an edge of a board shield, which covers a circuit board, being in contact with a ground pattern provided in an outer peripheral portion of the circuit board, noise is prevented from leaking to the outside of the circuit board shield.

SUMMARY

In the structure of Patent Document 1 described above, since the ground pattern needs to be provided over the entire periphery of the outer peripheral portion of the circuit board, the mounting region for the electronic components is narrow due to the region of the ground pattern.

It is desirable to provide an electronic device that can have a narrowed region of a ground pattern on a circuit board.

According to an embodiment of the present disclosure, there is provided an electronic device including a circuit board having a first surface and a second surface, a first member for covering the first surface to function as a shield of the circuit board, and a second member placed on a side of the second surface. The first member has a first encompassing region surrounding an electronic component mounted on the first surface. The first encompassing region has, in at least a portion thereof, a first outer region located on an outer side of an outer edge of the circuit board. The second member has a second outer region located on the outer side of the outer edge of the circuit board. One of the first outer region and the second outer region has at least one outer fixed portion fixed to another of the first outer region and the second outer region and at least one projection located away from the at least one outer fixed portion in a direction along the outer edge of the circuit board. The first member and the second member are in contact with each other with the at least one outer fixed portion and the at least one projection. With this, the ground pattern on the circuit board can have a reduced region size.

BRIEF DESCRIPTION OF THE DRAWINGS

FIG. 3A is a plan view illustrating the circuit board unit from which an upper board shield has been removed;

FIG. 5 is a sectional view taken along the line V-V of FIG. 1A;

DETAILED DESCRIPTION OF THE PREFERRED EMBODIMENT

1. Overview of Circuit Board Unit

Figure 1A:
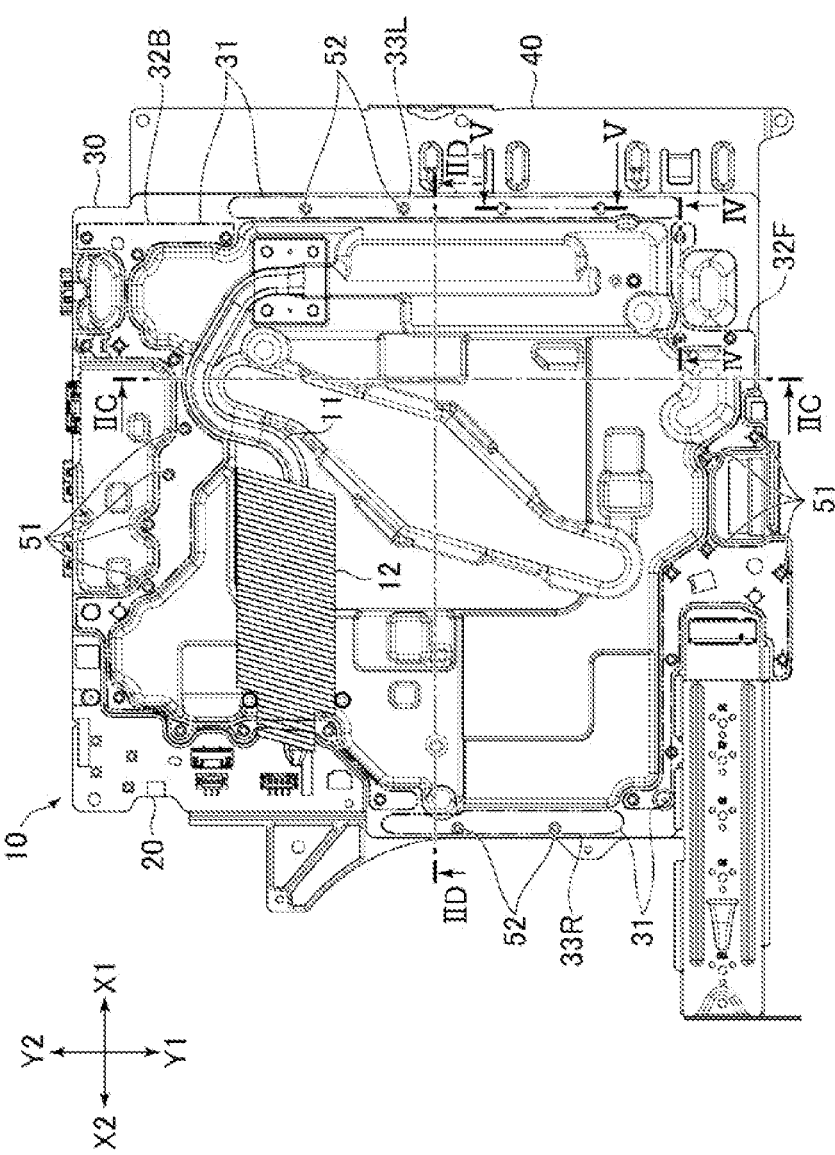
FIG. 1A is a plan view of a circuit board unit that is provided inside an electronic device according to an exemplary embodiment of the present disclosure.
Figure 1B:
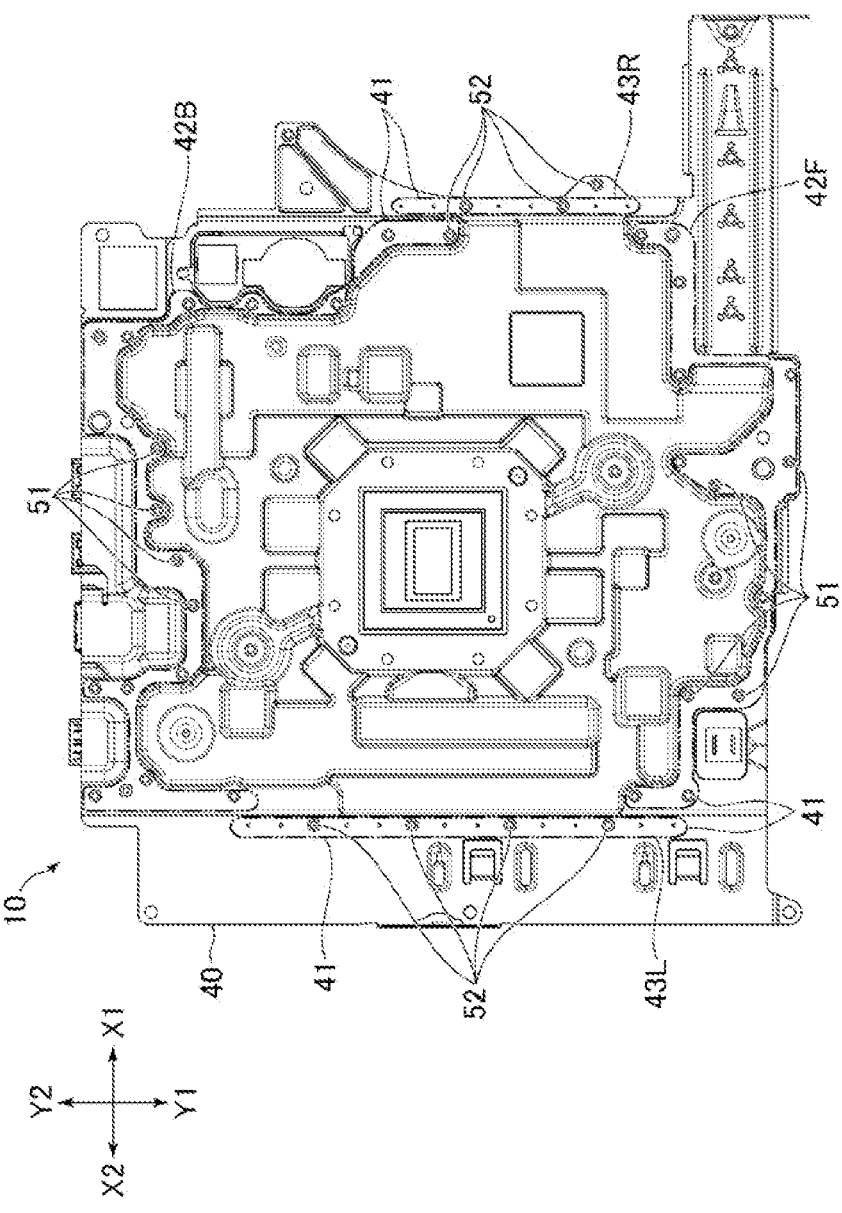
FIG. 1B is a bottom view of the circuit board unit.
Figure 2A:
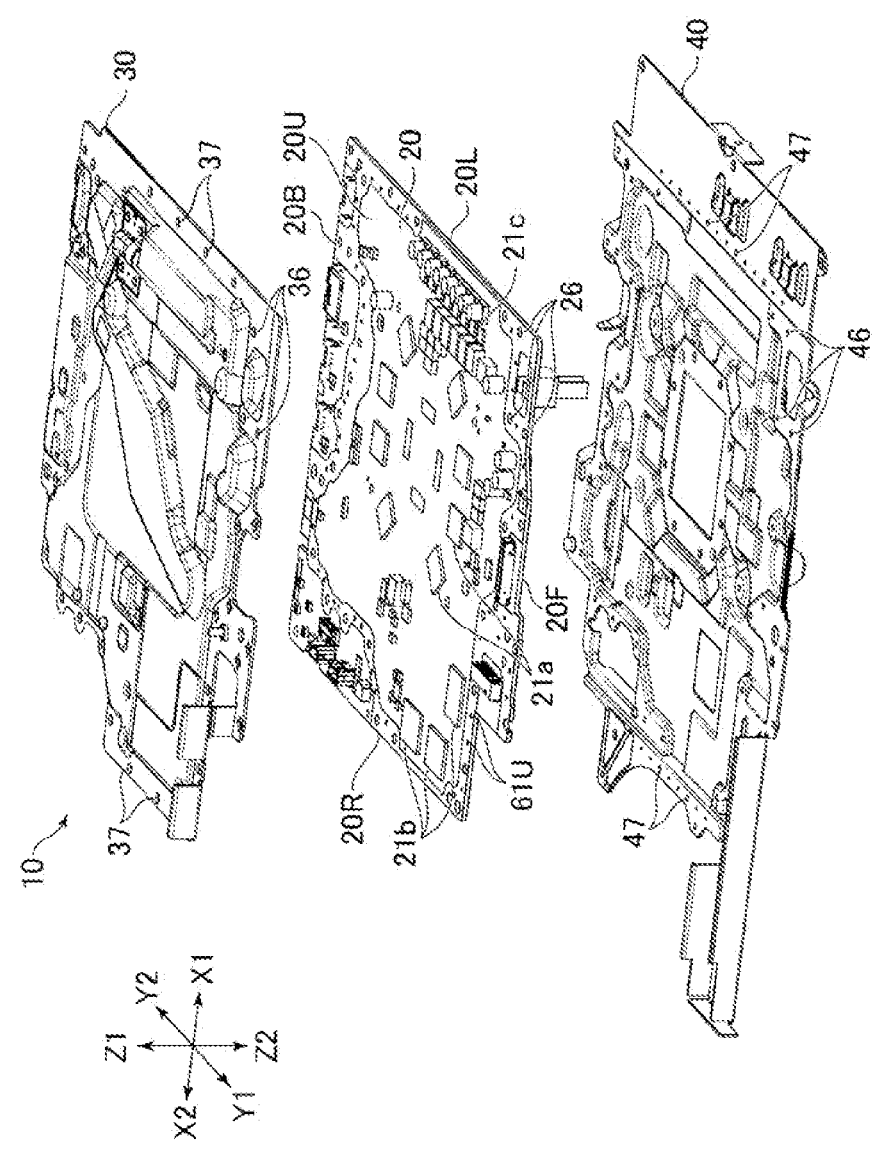
FIG. 2A is an exploded perspective view of the circuit board unit.
Figure 2B:
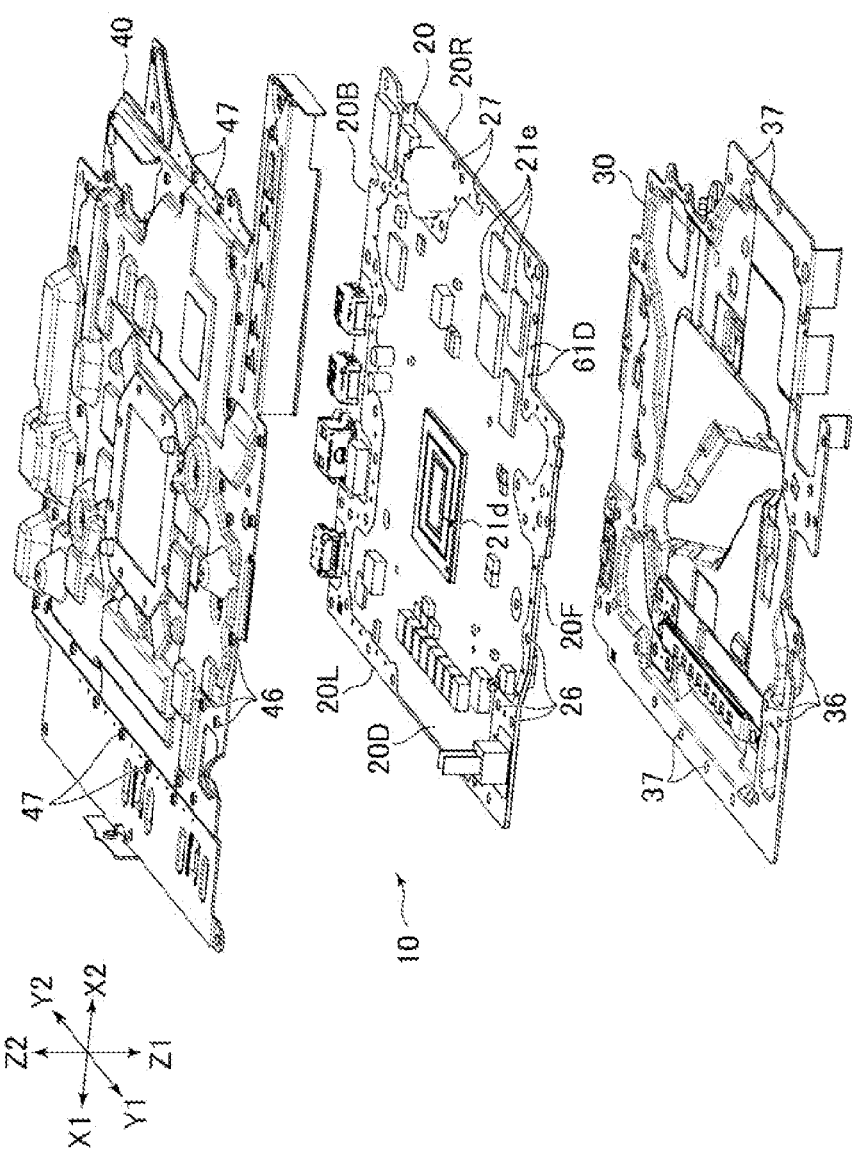
FIG. 2B is another exploded perspective view of the circuit board unit.

FIG. 1A is a plan view illustrating the front side of a circuit board unit 10 that is provided inside an electronic device according to an exemplary embodiment of the present disclosure. FIG. 1B is a bottom view illustrating the back side of the circuit board unit 10. FIG. 2A and FIG. 2B are exploded perspective views illustrating components of the circuit board unit 10. As illustrated in FIG. 1A and FIG. 1B, the circuit board unit 10 includes a circuit board 20, a first circuit board shield 30 (first member), and a second circuit board shield 40 (second member). The circuit board 20 has a first surface 20U (see FIG. 2A) and a second surface 20D (see FIG. 2B). The first circuit board shield 30 covers the first surface 20U of the circuit board 20. The second circuit board shield 40 covers the second surface 20D of the circuit board 20. As illustrated in FIG. 1A, the circuit board unit 10 has mounted thereon a heat pipe 11 and a heat sink 12.

In the following description, a Z1 direction and a Z2 direction in the Z axis illustrated in FIG. 2 and the like are referred to as upward and downward, respectively. Then, the first surface 20U of the circuit board 20 is referred to as an upper surface 20U, and the second surface 20D of the circuit board 20 is referred to as a lower surface 20D. The first circuit board shield 30 is referred to as an upper board shield 30, and the second circuit board shield 40 is referred to as a lower board shield 40. Further, in the following description, an example in which the circuit board 20 has outer edges 20F and 20B along the X axis illustrated in FIG. 2 and the like and outer edges 20L and 20R along the Y axis is described. An X1 direction and an X2 direction in the X axis illustrated in FIG. 2 and the like are referred to as a left direction and a right direction, respectively, and a Y1 direction and a Y2 direction in the Y axis are referred to as forward and backward, respectively. The front-side outer edge 20F, the back-side outer edge 20B, the left-side outer edge 20L, and the right-side outer edge 20R of the circuit board 20 are sometimes referred to as a front edge 20F, a back edge 20B, a left edge 20L, and a right edge 20R, respectively. However, these directions and placement positions are defined to describe the shapes and relative positional relations of elements, such as parts, members, and portions, of the circuit board unit 10 and not intended to limit the posture of the circuit board unit 10 in the electronic device.

2. Internal Structure of Circuit Board Unit

As illustrated in FIG. 2A, a plurality of electronic components such as integrated circuit chips 21*a* and 21*b* and a transistor 21*c* are mounted on the upper surface 20U of the circuit board 20. Further, as illustrated in FIG. 2B, a plurality of electronic components such as integrated circuit chips 21*d* and 21*e* are mounted on the lower surface 20D of the circuit board 20. Note that, in the example illustrated in FIG. 2B, the lower surface of the integrated circuit chip 21*d* is covered by a thermally conductive member.

The upper board shield 30 and the lower board shield 40 prevent noise such as electromagnetic waves generated on the circuit board 20 from leaking to the outside of the circuit board unit 10. The upper board shield 30 and the lower board shield 40 are produced by performing sheet metal processing such as drawing on a conductive metal sheet such as an iron or aluminum sheet. The upper board shield 30 is fixed to the lower board shield 40 with a plurality of screws 51 and 52. The circuit board 20 is fixed to the upper board shield 30 and the lower board shield 40 with the plurality of screws 51. Note that the circuit board 20 may be fixed to the board shields 30 and 40 with rivets or the like instead of the screws 51 and 52.

Figure 2C:
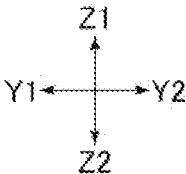
FIG. 2C is a sectional view taken along the line IIC-IIC of FIG. 1A.
Figure 2C:
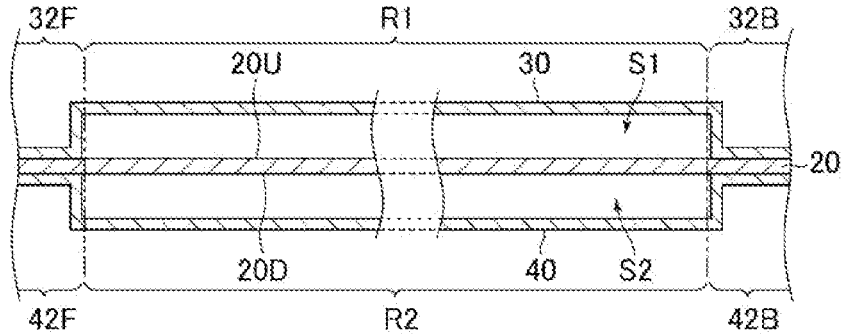
Figure 2D:
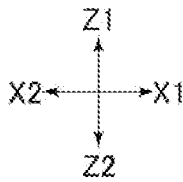
FIG. 2D is a sectional view taken along the line IID-IID of FIG. 1A.
Figure 2D:
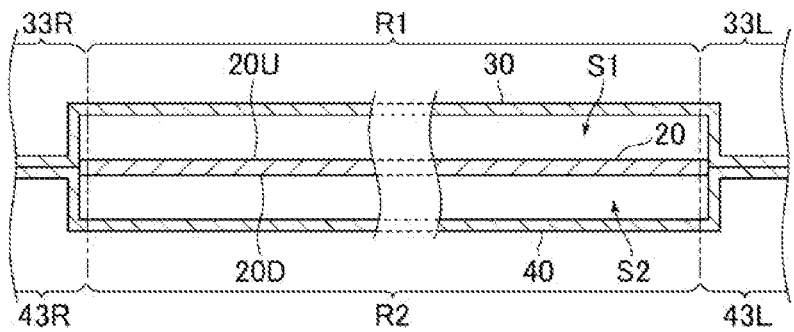

FIG. 2C is a sectional view taken along the line IIC-IIC of FIG. 1A. FIG. 2D is a sectional view taken along the line IID-IID of FIG. 1A. As illustrated in FIG. 2C and FIG. 2D, above the circuit board 20, a shielded space 51, which is a space closed by the circuit board 20 and the upper board shield 30, is formed. Further, under the circuit board 20, a shielded space S2, which is a space closed by the circuit board 20 and the lower board shield 40, is formed.

Figure 3B:
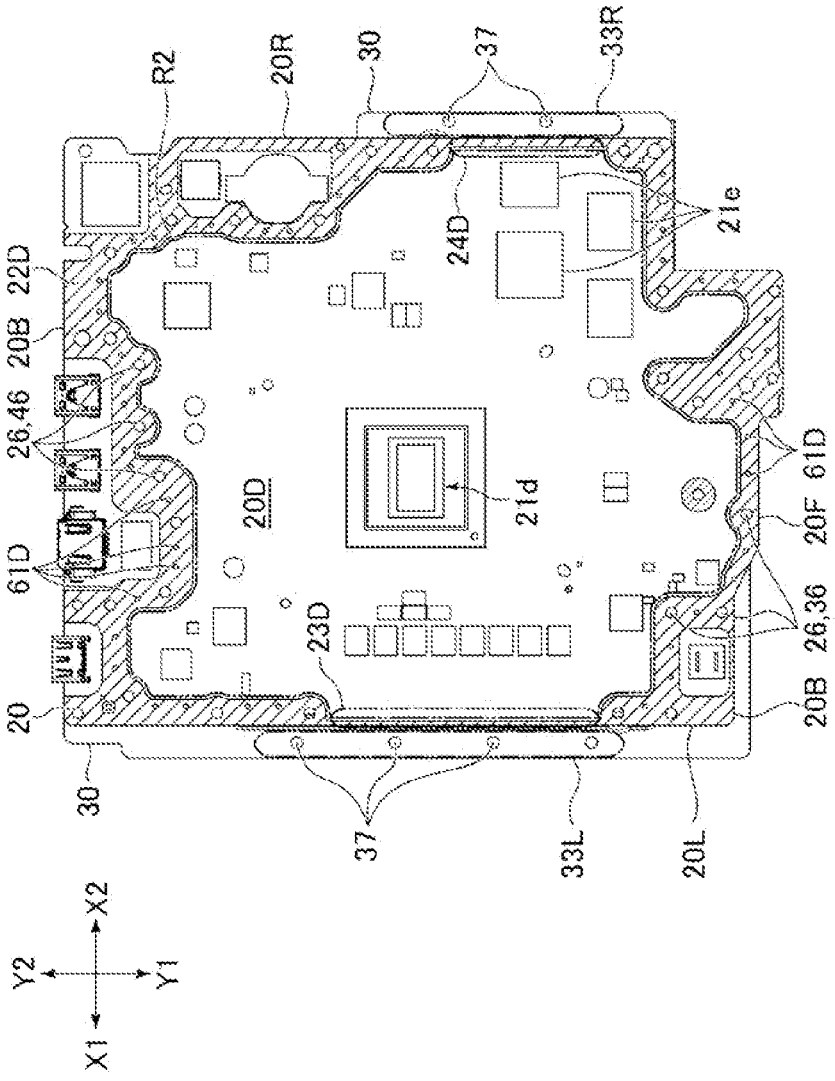
FIG. 3B is a bottom view illustrating the circuit board unit from which a lower board shield has been removed.

FIG. 3A is a plan view illustrating the circuit board unit 10 illustrated in FIG. 1A from which the upper board shield 30 has been removed. FIG. 3B is a bottom view illustrating the circuit board unit 10 illustrated in FIG. 1B from which the lower board shield 40 has been removed. In the respective hatched portions of FIG. 3A and FIG. 3B, corresponding ground patterns 22U and 22D that serve as a reference potential for an electronic circuit are formed.

As illustrated in FIG. 3A, the upper ground pattern 22U (first ground pattern) formed on the upper surface 20U of the circuit board 20 surrounds, on the upper surface 20U, an upper mounting region R1 in which the plurality of electronic components such as the integrated circuit chips 21*a* and 21*b* and the transistor 21*c* are mounted. The ground pattern 22U has a linear shape with a predetermined width and continuously surrounds the mounting region R1. At least a portion of the ground pattern 22U is formed along the edges of the circuit board 20. Further, as illustrated in FIG. 3B, the lower ground pattern 22D (second ground pattern) formed on the lower surface 20D of the circuit board 20 surrounds, on the lower surface 20D, a lower mounting region R2 in which the plurality of electronic components such as the integrated circuit chips 21*d* and 21*e* are mounted.

As illustrated in FIG. 1A and FIG. 2A, the upper board shield 30 has an upper encompassing region 31 (first encompassing region) (see FIG. 1A) surrounding the plurality of electronic components such as the integrated circuit chips 21*a* and 21*b* and the transistor 21*c* (see FIG. 2A) mounted on the upper surface 20U of the circuit board 20. Similarly, as illustrated in FIG. 1B and FIG. 2B, the lower board shield 40 has a lower encompassing region 41 (second encompassing region) (see FIG. 1B) surrounding the plurality of electronic components such as the integrated circuit chips 21*d* and 21*e* (see FIG. 2B) mounted on the lower surface 20D of the circuit board 20. In the plan view of the circuit board unit 10, the upper encompassing region 31 of the upper board shield 30 has a portion overlapping the circuit board 20 and a portion overlapping the lower board shield 40. Further, the lower encompassing region 41 of the lower board shield 40 has a portion overlapping the circuit board 20 and a portion overlapping the upper board shield 30. At least a portion of the upper encompassing region 31 overlaps the lower encompassing region 41.

As illustrated in FIG. 1A, the upper encompassing region 31 of the upper board shield 30 has inner contact regions 32F and 32B (first inner contact regions) located on the inner sides of the outer edges of the circuit board 20 and outer contact regions 33L and 33R (first outer contact regions) located on the outer sides of the outer edges of the circuit board 20. Similarly, as illustrated in FIG. 1B, the lower encompassing region 41 of the lower board shield 40 has inner contact regions 42F and 42B (second inner contact regions) located on the inner sides of the outer edges of the circuit board 20 and outer contact regions 43L and 43R (second outer contact regions) located on the outer sides of the outer edges of the circuit board 20.

As illustrated in FIG. 1A and FIG. 2A, in the upper encompassing region 31 of the upper board shield 30, the inner contact region 32F is formed along the front edge 20F of the circuit board 20, and the inner contact region 32B is formed along the back edge 20B of the circuit board 20. Further, in the upper encompassing region 31 of the upper board shield 30, the outer contact region 33L is formed along the left edge 20L of the circuit board 20, and the outer contact region 33R is formed along the right edge 20R of the circuit board 20. The inner contact regions 32F and 32B are in contact with the outer contact regions 33L and 33R. Then, the inner contact regions 32F and 32B and the outer contact regions 33L and 33R surround the entire periphery of the upper mounting region R1 (see FIG. 3A), in which the plurality of electronic components that are noise generation sources are mounted, on the upper surface 20U of the circuit board 20. The inner contact regions 32F and 32B and the outer contact regions 33L and 33R are formed outward from the positions of edges of the upper mounting region R1 to have predetermined widths and continuously formed to surround the entire periphery of the upper mounting region R1.

Further, as illustrated in FIG. 1B and FIG. 2B, in the lower encompassing region 41 of the lower board shield 40, the inner contact region 42F is formed along the front edge 20F of the circuit board 20, the inner contact region 42B is formed along the back edge 20B of the circuit board 20, the outer contact region 43L is formed along the left edge 20L of the circuit board 20, and the outer contact region 43R is formed along the right edge 20R of the circuit board 20. The inner contact regions 42F and 42B are in contact with the outer contact regions 43L and 43R. The inner contact regions 42F and 42B and the outer contact regions 43L and 43R surround the entire periphery of the lower mounting region R2 (see FIG. 3B), in which the plurality of electronic components that are noise generation sources are mounted, on the lower surface 20D of the circuit board 20. The inner contact regions 42F and 42B and the outer contact regions 43L and 43R are formed outward from the positions of edges of the lower mounting region R2 to have predetermined widths and continuously formed to surround the entire periphery of the lower mounting region R2.

3. Noise Shielding Structure Inside Circuit Board

Figure 4:
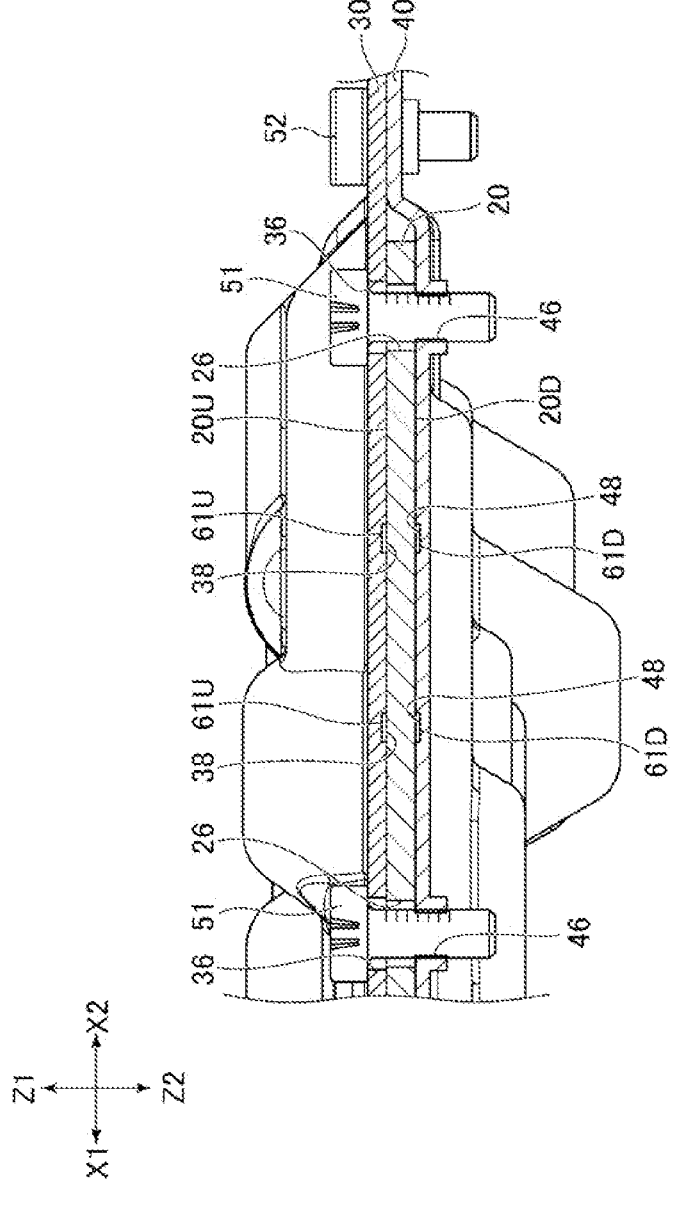
FIG. 4 is a sectional view taken along the line IV-IV of FIG. 1A.

FIG. 4 is a sectional view taken along the line IV-IV of FIG. 1A. The inner contact region 32F (see FIG. 1A) of the upper board shield 30 is in contact with the upper surface 20U of the circuit board 20 as illustrated in FIG. 4. The inner contact region 32B of the upper board shield 30 is also in contact with the upper surface 20U of the circuit board 20. More specifically, the inner contact regions 32F and 32B are in contact with the upper ground pattern 22U (see the hatched portion of FIG. 3A) formed on the upper surface 20U of the circuit board 20. As illustrated in FIG. 2C and FIG. 4, with the inner contact regions 32F and 32B of the upper board shield 30 being in contact with the ground pattern 22U of the circuit board 20, noise such as electromagnetic waves generated on the upper surface 20U of the circuit board 20 can be prevented from leaking to the outside of the shielded space S1 closed by the upper surface 20U and the upper board shield 30.

Further, as illustrated in FIG. 4, the inner contact regions 42F and 42B (see FIG. 1B) of the lower board shield 40 are in contact with the lower ground pattern 22D (see the hatched portion of FIG. 3B) formed on the lower surface 20D of the circuit board 20. As illustrated in FIG. 2C and FIG. 4, with the inner contact regions 42F and 42B of the lower board shield 40 being in contact with the ground pattern 22D of the circuit board 20, noise generated on the lower surface 20D of the circuit board 20 can be prevented from leaking to the outside of the shielded space S2 closed by the lower surface 20D and the lower board shield 40.

The inner contact regions 32F and 32B of the upper board shield 30 have, as illustrated in FIG. 2A, FIG. 2B, and FIG. 4, a plurality of mounting holes 36 (inner fixed portions) for fixing to the circuit board 20. Similarly, the inner contact regions 42F and 42B of the lower board shield 40 have a plurality of mounting holes 46 for fixing to the circuit board 20. The ground patterns 22U and 22D of the circuit board 20 have a plurality of mounting holes 26. As illustrated in FIG. 4, the positions of the mounting holes 36, 26, and 46, which are provided in the upper board shield 30, the circuit board 20, and the lower board shield 40, respectively, match each other, and the single screw 51 is mounted in these mounting holes 36, 26, and 46. In this way, with the upper board shield 30, the circuit board 20, and the lower board shield 40 tightened together with the single screw, the board shields 30 and 40 are in contact with the ground patterns 22U and 22D of the circuit board 20 at the positions of the mounting holes 36, 26, and 46, so that enhanced shielding performance for noise generated on the circuit board 20 can be provided.

As illustrated in FIG. 3A, the upper ground pattern 22U formed on the upper surface 20U of the circuit board 20 has a plurality of projections 61U protruding upward. The position of the projection 61U is located away from the mounting hole 26 provided in the upper ground pattern 22U, in the extending direction of the upper ground pattern 22U. In other words, in the extending direction of the upper ground pattern 22U, the projection 61U is formed between the adjacent two mounting holes 26. Similarly, as illustrated in FIG. 3B, the lower ground pattern 22D formed on the lower surface 20D of the circuit board 20 has a plurality of projections 61D protruding downward. The position of the projection 61D is located away from the mounting hole 26 provided in the lower ground pattern 22D, in the extending direction of the lower ground pattern 22D. The projections 61U and 61D may be formed by putting a conductive member such as a solder on the ground patterns 22U and 22D. The number of the projections 61U and 61D formed between the adjacent mounting holes 26 is preferably two or less.

Enhanced shielding performance for noise generated on the circuit board 20 can be provided. Further, the projections 61U and 61D may be formed by performing sheet metal processing on the board shields 30 and 40. In this manner, the projections 61U and 61D can easily be formed inside the circuit board 20.

As illustrated in FIG. 1A and FIG. 4, the inner contact regions 32F and 32B of the upper board shield 30 have inner contact portions 38 (first contact portions) in contact with the upper ground pattern 22U via the projections 61U. Similarly, the inner contact regions 42F and 42B of the lower board shield 40 (see FIG. 1B) have inner contact portions 48 (second contact portions) in contact with the lower ground pattern 22D via the projections 61D. In this manner, at the positions of the projections 61U and 61D, the board shields 30 and 40 are in contact with the ground patterns 22U and 22D of the circuit board 20 with enough stability, so that enhanced shielding performance for noise generated on the circuit board 20 can be provided.

In the following description, the positions of the mounting holes 26, 36, and 46 of the circuit board 20 and the board shields 30 and 40 into which the screw 51 is inserted and the positions at which the projections 61U and 61D are provided are also referred to as inner contact points. The distance between adjacent two of the plurality of inner contact points provided on the ground patterns 22U and 22D of the circuit board 20 is desirably determined on the basis of the wavelength of noise, the leakage of which to the outside is to be prevented.

In the inner contact regions 32F and 32B of the upper board shield 30, the inner contact portion 38 in contact with the projection 61U is located away from the mounting hole 36 in the extending direction of the inner contact regions 32F and 32B. Further, the inner contact portion 38 in contact with one of the adjacent two projections 61U is located away from the inner contact portion 38 in contact with the other projection 61U, in the extending direction of the inner contact regions 32F and 32B. Similarly, in the inner contact regions 42F and 42B of the lower board shield 40, the inner contact portion 48 in contact with the projection 61D is located away from the mounting hole 46 in the extending direction of the inner contact regions 42F and 42B, and the inner contact portion 48 in contact with one of the adjacent two projections 61D is located away from the inner contact portion 48 in contact with the other projection 61D, in the extending direction of the inner contact regions 42F and 42B. Then, the distance between those (that is, the distance between the adjacent two inner contact points) may be set to a value less than a third of the wavelength of noise that the board shields 30 and 40 shield, more preferably, less than a quarter of the wavelength. Further, the distance between every adjacent two inner contact points is preferably 20 mm. With this, the leakage of noise in frequency bands that are used for wireless communications and the like can effectively be prevented. The distance between every adjacent two inner contact points is preferably 15 mm or less. The distance between every adjacent two contact points is further preferably 10 mm or less.

In FIG. 3A and FIG. 3B, the mounting holes 26, 36, and 46 are indicated by the circles having substantially the same size, and the projections 61U and 61D are indicated by the circles smaller than the mounting holes 26, 36, and 46. As illustrated in FIG. 3A and FIG. 3B, the distance between every adjacent two of the inner contact points at the positions of the plurality of mounting holes 26, 36, and 46 provided in the inner contact regions 32F, 32B, 42F, and 42B and the plurality of projections 61U and 61D is set to 20 mm or less (a value less than a third of the wavelength corresponding to 5 GHz). In this manner, noise can more effectively be prevented from leaking from the inner contact regions 32F, 32B, 42F, and 42B.

4. Noise Shielding Structure Outside Circuit Board

FIG. 5 is a sectional view taken along the line V-V of FIG. 1A. The outer contact region 33L (see FIG. 1A) of the upper board shield 30 and the outer contact region 43L (see FIG. 1B) of the lower board shield 40 are in contact with each other as illustrated in FIG. 2D and FIG. 5. Further, the outer contact region 33R of the upper board shield 30 and the outer contact region 43R of the lower board shield 40 are also in contact with each other. In this way, with the outer contact regions 33L and 33R of the upper board shield 30 being in contact with the outer contact regions 43L and 43R of the lower board shield 40, noise generated on the circuit board 20 can be prevented from leaking to the outside of the shielded spaces 51 and S2 closed by the board shields 30 and 40. That is, the regions for shielding noise can be formed outside the circuit board 20, so that the ground patterns 22U and 22D inside the circuit board 20 can have narrowed regions.

As illustrated in FIG. 3A, on the upper surface 20U of the circuit board 20, there are a region 23U in which the upper ground pattern 22U is not formed along the left edge 20L of the circuit board 20 and a region 24U in which the mounting hole 26 and the projection 61U of the upper ground pattern 22U are not formed along the right edge 20R of the circuit board 20. Since noise traveling to the regions 23U and 24U is shielded by the outer contact regions 33L and 33R of the upper board shield 30, the noise can be prevented from leaking to the outside of the shielded space S1. Moreover, the upper ground pattern 22U can have a narrowed region, so that the upper mounting region R1, in which the electronic components are mounted, can be expanded to the vicinity of the edges (the left edge 20L and the right edge 20R of FIG. 3A) of the circuit board 20.

Further, as illustrated in FIG. 3B, on the lower surface 20D of the circuit board 20, there are a region 23D in which the lower ground pattern 22D is not formed along the left edge 20L of the circuit board 20 and a region 24D in which the mounting hole 26 and the projection 61D of the lower ground pattern 22D are not formed along the right edge 20R of the circuit board 20. Further, as illustrated in FIG. 2D, since noise traveling to the regions 23D and 24D is shielded by the outer contact regions 43L and 43R of the lower board shield 40, the noise can be prevented from leaking to the outside of the shielded space S2. Moreover, the lower ground pattern 22D can have a narrowed region, so that the lower mounting region R2, in which the electronic components are mounted, can be expanded to the vicinity of the edges (the left edge 20L and the right edge 20R of FIG. 3B) of the circuit board 20.

As illustrated in FIG. 3B and FIG. 5, the outer contact regions 33L and 33R of the upper board shield 30 have a plurality of mounting holes 37 (outer fixed portions) for fixing to the outer contact regions 43L and 43R of the lower board shield 40. Further, as illustrated in FIG. 3A and FIG. 5, the outer contact regions 43L and 43R of the lower board shield 40 have a plurality of mounting holes 47 for fixing to the outer contact regions 33L and 33R of the upper board shield 30. As illustrated in FIG. 5, the positions of the mounting holes 37 and 47 provided in the board shields 30 and 40, respectively, match each other, and the single screw 52 is mounted in these mounting holes 37 and 47. In this way, with the board shields 30 and 40 being tightened together with the single screw, the upper board shield 30 is in contact with the lower board shield 40 at the positions of the mounting holes 37 and 47, so that enhanced shielding performance for noise generated on the circuit board 20 can be provided.

As illustrated in FIG. 3A, the outer contact regions 43L and 43R of the lower board shield 40 have a plurality of projections 62 (outer contact projections) protruding upward. The position of the projection 62 is located away from the mounting holes 47 formed in the outer contact regions 43L and 43R in the direction along the left edge 20L and the right edge 20R of the circuit board 20 (the extending direction of the outer contact regions 43L and 43R). In other words, the projection 62 is formed between the two mounting holes 47 in the extending direction of the outer contact regions 43L and 43R. The projections 62 of the lower board shield 40 are formed by performing sheet metal processing on the outer contact regions 43L and 43R. In this manner, the projections 62 are easily formed on the lower board shield 40. The present disclosure is not limited to this, and the projections 62 may be formed by putting a conductive member such as a solder on the outer contact regions 43L and 43R. The number of the projections 62 that are formed between the adjacent mounting holes 47 is preferably two or less.

As illustrated in FIG. 1A and FIG. 5, the outer contact regions 33L and 33R of the upper board shield 30 have outer contact portions 63 in contact with the projections 62 of the lower board shield 40. With this, the upper board shield 30 is in contact with the lower board shield 40 at the positions of the projections 62, so that enhanced shielding performance for noise generated on the circuit board 20 can be provided.

As illustrated in FIG. 2C and FIG. 2D, the shielded space S1 on the upper surface 20U side of the circuit board 20 is formed with the circuit board 20 (more specifically, the upper ground pattern 22U) being in contact with the inner contact regions 32F and 32B of the upper board shield 30, and the outer contact regions 33L and 33R of the upper board shield 30 being in contact with the outer contact regions 43L and 43R of the lower board shield 40. Similarly, the shielded space S2 on the lower surface 20D side of the circuit board 20 is formed with the circuit board 20 (more specifically, the lower ground pattern 22D) being in contact with the inner contact regions 42F and 42B of the lower board shield 40, and the outer contact regions 33L and 33R of the upper board shield 30 being in contact with the outer contact regions 43L and 43R of the lower board shield 40. In short, as illustrated in FIG. 2D, the projections 62 formed in the outer contact regions 43L and 43R of the lower board shield 40 and the outer contact portions 63 provided in the outer contact regions 33L and 33R of the upper board shield 30 are used in common as measures against noise for the shielded spaces S1 and S2 formed above and under the circuit board 20, respectively. With the outer contact regions 33L and 43L of the board shields 30 and 40 being in contact with each other via the projections 62 and the outer contact portions 63 and the outer contact regions 33R and 43R of the board shields 30 and 40 being in contact with each other via the projections 62 and the outer contact portions 63, noise can be prevented from leaking from the shielded spaces S1 and S2 formed above and under the circuit board 20, respectively.

In the following description, the positions of the mounting holes 37 and 47 of the board shields 30 and 40 into which the screw 52 is inserted and the position at which the projection 62 is provided are also referred to as outer contact points. In short, an outer contact point is, in the portion in which the outer contact regions 33L and 33R of the upper board shield 30 and the outer contact regions 43L and 43R of the lower board shield 40 face and overlap each other in the plan view, the point at which the upper board shield 30 is in contact with the lower board shield 40. The distance between adjacent two of the plurality of outer contact points provided in the outer contact regions 33L and 33R of the upper board shield 30 and the outer contact regions 43L and 43R of the lower board shield 40 is desirably determined on the basis of the wavelength of noise, the leakage of which to the outside is to be prevented, like the inner contact points.

In the outer contact regions 43L and 43R of the lower board shield 40, the projection 62 is located away from the mounting hole 37 in the extending direction of the outer contact regions 43L and 43R. Then, the distance between the mounting hole 37 and the projection 62 and the distance between the adjacent two projections 62 (that is, the distance between the adjacent two outer contact points) may be set to a value less than a third of the wavelength of noise that the board shields 30 and 40 shield, more preferably, less than a quarter of the wavelength. The distance between the mounting hole 37 and the projection 62 and the distance between the adjacent two projections 62 may each be set to 20 mm. In this manner, the leakage of noise in frequency bands that are used for wireless communications and the like can effectively be prevented. The distance between the mounting hole 37 and the projection 62 and the distance between the adjacent two projections 62 are each preferably 15 mm or less. The distance between the mounting hole 37 and the projection 62 and the distance between the adjacent two projections 62 are each further preferably 10 mm or less.

In FIG. 3A and FIG. 3B, the mounting holes 37 and 47 are indicated by the circles having substantially the same size, and the projections 62 are indicated by the circles (points) smaller than the mounting holes 37 and 47. As illustrated in FIG. 3A and FIG. 3B, the distance between every adjacent two of the outer contact points provided in the outer contact regions 33L, 33R, 43L, and 43R may be set to 20 mm or less. In this manner, noise can more effectively be prevented from leaking from the outer contact regions 33L, 33R, 43L, and 43R. The distance between every adjacent two outer contact points is preferably 15 mm or less. The distance between every adjacent two outer contact points is further preferably 10 mm or less.

As illustrated in FIG. 3A and FIG. 5, at least one projection 62 is formed between the two mounting holes 37 in the outer contact regions 43L and 43R of the lower board shield 40. Further, the single mounting hole 37 is formed between the two projections 62 in the outer contact regions 43L and 43R of the lower board shield 40. Note that the number of the mounting holes 37 that are placed between the two projections 62 may be two or more.

Figure 6:
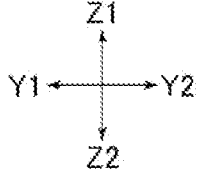
FIG. 6 is a schematic diagram illustrating the cross sections of outer contact regions of the upper board shield and the lower board shield.
Figure 6:
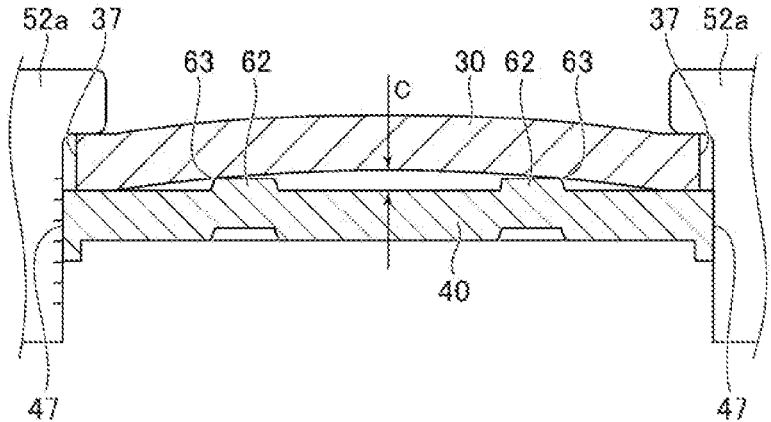

FIG. 6 is a schematic diagram of the cross sections of the outer contact regions 33L, 33R, 43L, and 43R of the upper board shield 30 and the lower board shield 40, illustrating the schematic cross sections of the cut surfaces along the extending direction of the ground patterns 22U and 22D. As illustrated in FIG. 6, the upper board shield 30 is pressed against the lower board shield 40 by heads 52a of the screws 52 at the positions of the mounting holes 37 to be in contact with the lower board shield 40. Then, with the warp relative to the lower board shield 40, the outer contact portions 63 of the upper board shield 30 are in contact with the projections 62. Thus, the upper board shield 30 desirably warps more easily than the lower board shield 40 having the projections 62 formed thereon. For example, the upper board shield 30 may be formed of a material different from the material of the lower board shield 40. The upper board shield 30 may be formed of a material softer (lower in rigidity) than the material of the lower board shield 40. For example, the upper board shield 30 may be formed of aluminum softer than iron that is the material of the lower board shield 40. Further, the thicknesses in the up-down direction of the upper board shield 30 of at least the outer contact regions 33L and 33R of the upper board shield 30 may be smaller than the thickness of the lower board shield 40.

As illustrated in FIG. 6, the upper board shield 30 warps upward with the outer contact portions 63 pushed up by the projections 62 of the lower board shield 40. With this, a gap C is formed between the two projections 62 in some cases. Here, on the lower board shield 40, when the number of the projections 62 that are formed between the two mounting holes 47 is three, the projection 62 between two of these three projections 62 may be placed near the gap C. Thus, as illustrated in FIG. 3A, on the lower board shield 40, the number of the projections 62 that are placed between the two mounting holes 47 is desirably two or less. In other words, in the outer contact regions 33L and 33R of the upper board shield 30, the number of the outer contact portions 63 that are in contact with the projection 62 provided between the two mounting holes 37 is desirably two or less. Further, on the upper ground pattern 22U of the circuit board 20, the number of the projections 61U (the number of the inner contact portions 38) that are placed between the two mounting holes 26 is also desirably two or less. As illustrated in FIG. 3B, on the lower ground pattern 22D of the circuit board 20, the number of the projections 61D (the number of the inner contact portions 48) that are placed between the two mounting holes 26 is also desirably two or less. In this manner, the upper board shield 30 is in contact with the lower board shield 40 with enough stability, so that enhanced shielding performance for noise generated on the circuit board 20 can be provided.

As illustrated in FIG. 3A and FIG. 3B, in the outer contact regions 33L, 33R, 43L, and 43R, the number of the projections 62 (the number of the outer contact portions 63) that are placed between the adjacent two mounting holes 37 or 47 is two or less. Further, in the inner contact regions 32F and 32B, the number of the projections 61U (the number of the inner contact portions 38) that are placed between the adjacent two mounting holes 36 is also two or less, and in the inner contact regions 42F and 42B, the number of the projections 61D (the number of the inner contact portions 48) that are placed between the adjacent two mounting holes 46 is also two or less. With this, noise can effectively be prevented from leaking from the regions surrounding the electronic components.

Figure 7:
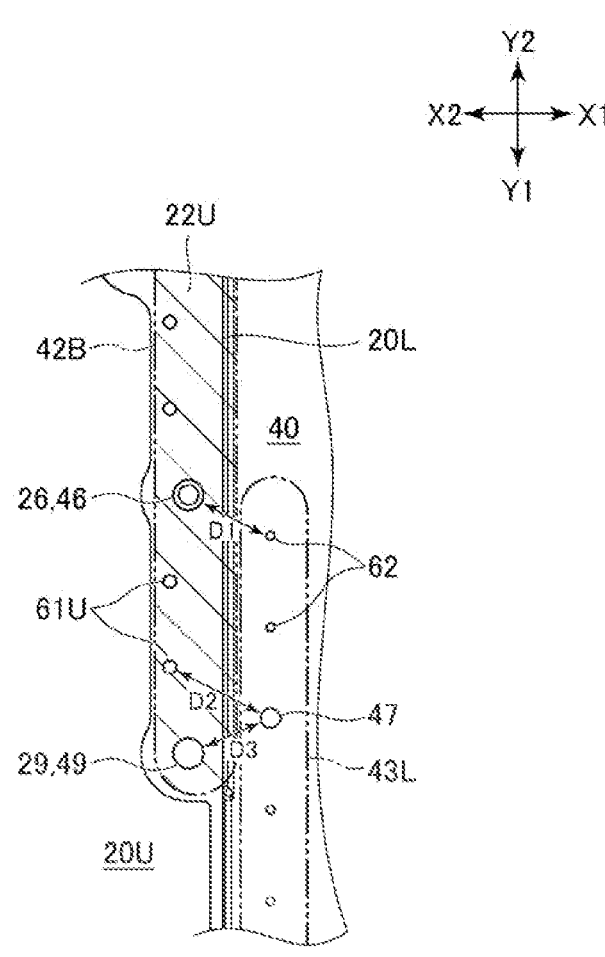
FIG. 7 is a partial enlarged view of FIG. 3A and a view illustrating an upper ground pattern of a circuit board and an outer contact region of the lower board shield.

FIG. 7 is a partial enlarged view of FIG. 3A and a view illustrating the upper ground pattern 22U of the circuit board 20 and the outer contact region 43L of the lower board shield 40. As illustrated in FIG. 7, the mounting holes 26 formed in the upper ground pattern 22U of the circuit board 20 and the projections 62 formed in the outer contact region 43L of the lower board shield 40 are located on the opposite sides across the left edge 20L of the circuit board 20. Further, the mounting holes 36 (see FIG. 3B) formed in the inner contact region 32B (see FIG. 1A) of the upper board shield 30 and the mounting holes 46 formed in the inner contact region 42B (see FIG. 1B) of the lower board shield 40 are placed at the same positions as the mounting holes 26 formed in common to the upper and lower ground patterns 22U and 22D. Thus, with the upper board shield 30 overlapping the circuit board 20 and the lower board shield 40 illustrated in FIG. 7, the mounting holes 26, 36, and 46 formed in the inner contact regions 32B and 42B and the projections 62 formed in the outer contact region 43L (the outer contact portions 63 in the outer contact region 33L) are located on the opposite sides across the left edge 20L of the circuit board 20.

Here, a distance D1 from the mounting holes 26, 36, and 46 formed in the inner contact regions 32B and 42B to the closest projection 62 (outer contact portion 63) located on the opposite side across the left edge 20L of the circuit board 20 may be set to a value less than a third of the wavelength of noise that the board shields 30 and 40 shield, more preferably, less than a quarter of the wavelength. Further, the distance D1 may be set to 20 mm or less, more preferably, 15 mm or less or 10 mm or less. Further, the number of the projections 62 that are formed between the mounting holes 26, 36, and 46 and the closest mounting hole 47 located on the opposite side across the left edge 20L of the circuit board 20 is preferably two or less. In such a case, the distances from the mounting holes 26, 36, 46, and 47 to the projection 62 and the distance between the projections 62 may each be set to a value less than a third of the wavelength of noise that the board shields 30 and 40 shield, more preferably, less than a quarter of the wavelength. Further, the distances may each be set to 20 mm or less, more preferably, 15 mm or less or 10 mm or less. In this manner, noise can be shielded at the boundary between the inner contact region 32B and the outer contact region 33L of the upper board shield 30 and the boundary between the inner contact region 42B and the outer contact region 43L of the lower board shield 40.

Further, as illustrated in FIG. 7, the mounting holes 47 formed in the outer contact region 43L of the lower board shield 40 and the projections 61U formed on the upper ground pattern 22U are located on the opposite sides across the left edge 20L of the circuit board 20. Further, the mounting holes 37 (see FIG. 3B) formed in the outer contact region 33L (see FIG. 1A) of the upper board shield 30 are placed at the same positions as the mounting holes 47 formed in the lower board shield 40. Thus, the mounting holes 37 and 47 formed in the outer contact regions 33L and 43L and the projections 61U formed on the upper ground pattern 22U are located on the opposite sides across the left edge 20L of the circuit board 20. Further, the mounting holes 37 and 47 and the inner contact portions 38 (see FIG. 4) of the upper board shield 30 in contact with the upper ground pattern 22U via the projections 61U are located on the opposite sides across the left edge 20L of the circuit board 20. Similarly, the mounting holes 37 and 47 may be located on the opposite side of the projections 61D of the lower ground pattern 22D and the inner contact portions 48 of the lower board shield 40 in contact with the projections 61D, across the left edge 20L of the circuit board 20.

Here, a distance D2 between the mounting holes 37 and 47 formed in the outer contact regions 33L and 43L and the projection 61U formed on the upper ground pattern 22U (the inner contact portion 38 of the upper board shield 30) may be set to a value less than a third of the wavelength of noise that the board shields 30 and 40 shield, more preferably, less than a quarter of the wavelength, like the distance D1. Further, the distance D2 may be set to 20 mm or less, more preferably, 15 mm or less or 10 mm or less. Further, the distance between the mounting holes 37 and 47 and the projection 61D formed on the lower ground pattern 22D (the contact portion 48 of the lower board shield 40) may also be set to a value less than a third of the wavelength of noise that the board shields 30 and 40 shield, more preferably, less than a quarter of the wavelength. The distance may be set to 20 mm or less, more preferably, 15 mm or less or 10 mm or less. Also in this case, noise can be shielded at the boundary between the inner contact region 32B and the outer contact region 33L of the upper board shield 30 and the boundary between the inner contact region 42B and the outer contact region 43L of the lower board shield 40.

Further, as illustrated in FIG. 7, the circuit board 20 and the lower board shield 40 have formed therein holes 29 and 49 for temporarily fixing the circuit board 20 to the lower board shield 40 in the manufacturing process of the circuit board unit 10. Here, the holes 29 and 49 are regarded as the mounting holes 29 and 49, and the mounting hole 36 of the upper board shield 30 is formed at the position corresponding to the mounting holes 29 and 49. With the single screw 51 being inserted into the mounting holes 36, 29, and 49, the circuit board 20 may be in contact with the board shields 30 and 40 at the positions of the mounting holes 36, 29, and 49. Then, a distance D3 between the mounting holes 36, 29, and 49 and the mounting holes 37 and 47 may be set to a value less than a third of the wavelength of noise that the board shields 30 and 40 shield, more preferably, less than a quarter of the wavelength, like the distance D1. Further, the distance D3 may be set to 20 mm or less, more preferably, 15 mm or less or 10 mm or less. Also in this case, noise can be shielded at the boundary between the inner contact region 42B and the outer contact region 43L.

Further, the above-mentioned noise shielding structure at the boundary between the inner contact region 32B and the outer contact region 33L of the upper board shield 30 may also be formed at the boundary between the inner contact region 32F and the outer contact region 33L, the boundary between the inner contact region 32B and the outer contact region 33R, and the boundary between the inner contact region 32F and the outer contact region 33R. In this manner, on the upper surface 20U of the circuit board 20, noise can be shielded at both the boundaries between the inner contact regions 32F and 32B surrounding the upper mounting region R1, in which the plurality of electronic components that are noise generation sources are mounted, and the outer contact regions 33L and 33R. That is, noise can be shielded in the regions continuously surrounding the upper mounting region R1. Further, the noise shielding structure at the boundary between the inner contact region 42B and the outer contact region 43L of the lower board shield 40 may also be formed at the boundary between the inner contact region 42F and the outer contact region 43L, the boundary between the inner contact region 42B and the outer contact region 43R, and the boundary between the inner contact region 42F and the outer contact region 43R. In this manner, on the lower surface 20D of the circuit board 20, noise can be shielded at both the boundaries between the inner contact regions 42F and 42B surrounding the lower mounting region R2, in which the plurality of electronic components that are noise generation sources are mounted, and the outer contact regions 43L and 43R. That is, noise can be shielded in the regions continuously surrounding the lower mounting region R2.

5. Conclusion

As described above, in the present embodiment, the inner contact regions 32F and 32B of the upper board shield 30 are in contact with the upper ground pattern 22U of the circuit board 20, and the inner contact regions 42F and 42B of the lower board shield 40 are in contact with the lower ground pattern 22D of the circuit board 20. Then, the outer contact region 33L of the upper board shield 30 is in contact with the outer contact region 43L of the lower board shield 40, and the outer contact region 33R of the upper board shield 30 is in contact with the outer contact region 43R of the lower board shield 40. With the outer contact regions 33L, 33R, 43L, and 43R having the mounting holes 37 and 47 and the projections 62, the outer contact regions 33L and 33R of the board shield 30 are in contact with the outer contact regions 43L and 43R of the board shield 40. In this manner, noise generated on the circuit board 20 can be prevented from leaking to the outside of the circuit board unit 10. Further, the regions for shielding noise can be provided outside the circuit board 20, so that the ground patterns 22U and 22D inside the circuit board 20 can have narrowed regions. As a result, the circuit board 20 can have an expanded area in which the electronic components and the like are mounted, or the compact circuit board 20 can be provided.

Note that the present disclosure is not limited to the embodiment described above.

In the example described in the embodiment, as the noise shielding structure outside the circuit board 20, the outer contact regions 43L and 43R of the lower board shield 40 have the plurality of projections 62 protruding upward, and the outer contact regions 33L and 33R of the upper board shield 30 are in contact with the projections 62. The present disclosure is not limited to this, and the outer contact regions 33L and 33R of the upper board shield 30 may have the plurality of projections 62 protruding downward, and the outer contact regions 43L and 43R of the lower board shield 40 may be in contact with the projections 62. Also in this case, the upper board shield 30 is contact with the lower board shield 40 at the positions of the projections 62, so that enhanced shielding performance for noise generated on the circuit board 20 can be provided.

In the example described in the embodiment, the upper encompassing region 31 of the upper board shield 30 has the inner contact regions 32F and 32B located on the inner sides of the outer edges of the circuit board 20 and the outer contact regions 33L and 33R located on the outer sides of the outer edges of the circuit board 20, and these contact regions surround the entire periphery of the region in which the electronic components are placed on the upper surface 20U of the circuit board 20. Here, on the board shields 30 and 40, the outer contact regions located on the outer sides of the outer edges of the circuit board 20 may surround the entire outer peripheral edge of the circuit board 20. In this manner, noise can be prevented from leaking to the outside of the circuit board 20 without forming the ground patterns 22U and 22D inside the circuit board 20.

In the example described in the embodiment, the upper board shield 30 has the two regions, namely, the outer contact regions 33L and 33R, and the lower board shield 40 has the two regions, namely, the outer contact regions 43L and 43R. The number of outer contact regions that the board shields 30 and 40 have may, however, be one. Further, in the outer contact regions where the board shields 30 and 40 are in contact with each other, the number of the mounting holes 37 and the number of the mounting hole 47 may be one, and the number of the projections 62 may also be one. Also in such an example, the region for shielding noise can be provided outside the circuit board 20, so that the ground patterns 22U and 22D inside the circuit board 20 can have narrowed regions.

It should be understood by those skilled in the art that various modifications, combinations, sub-combinations and alterations may occur depending on design requirements and other factors insofar as they are within the scope of the appended claims or the equivalents thereof

What is claimed is:

1. An electronic device comprising:
a circuit board having a first surface and a second surface;
a first member for covering the first surface to function as a shield of the circuit board; and
a second member placed on a side of the second surface, wherein:
the first member has a first encompassing region surrounding an electronic component mounted on the first surface,
the first encompassing region has, in at least a portion thereof, a first outer region located on an outer side of an outer edge of the circuit board,
the second member has a second outer region located on the outer side of the outer edge of the circuit board,
the second outer region has:
a first outer fixed portion and a second outer fixed portion fixed to the first outer region, and
at least two projections located between the first outer fixed portion and the second outer fixed portion in a direction along the outer edge of the circuit board that protrude from a surrounding surface of second outer region,
the first member and the second member are in contact with each other at the first outer fixed portion and the second outer fixed portion by fasteners, and
the first member warps upwards away from the surrounding surface of the second outer region at a region where the first member contacts the at least two projections thereby forming a gap between the first member and the second member in a space between the at least two projections.

2. The electronic device according to claim 1, wherein the second member is a member for covering the second surface to function as a shield of the circuit board and has a second encompassing region surrounding an electronic component mounted on the second surface, and
the second encompassing region has, in at least a portion thereof, the second outer region.

3. The electronic device according to claim 1, wherein the first encompassing region has a first inner region in contact with a ground pattern formed on the first surface of the circuit board.

4. The electronic device according to claim 3, wherein the first inner region has
at least one inner fixed portion fixed to the circuit board, and
at least one inner contact portion being located away from the at least one inner fixed portion in an extending direction of the first encompassing region and being in contact with the ground pattern.

5. The electronic device according to claim 4, wherein the first outer fixed portion, the second outer fixed portion, and the at least two projections form contact points between the first member and the second member across the outer edge of the circuit board,
the at least one inner fixed portion and the at least one inner contact portion form contact points between the first member and the ground pattern, and a distance between two of the contact points adjacent to each other across the outer edge of the circuit board is less than a third of a wavelength of noise that the first member shields.

6. The electronic device according to claim 4, wherein the first outer fixed portion, the second outer fixed portion, and the at least two projections form contact points between the first member and the second member across the outer edge of the circuit board, the at least one inner fixed portion and the at least one inner contact portion form contact points between the first member and the ground pattern, and a distance between two of the contact points adjacent to each other across the outer edge of the circuit board is 20 mm or less.

7. The electronic device according to claim 1, wherein the at least two projections are formed by sheet metal processing.

8. The electronic device according to claim 1, wherein the second outer region further has an additional projection that protrudes from the surrounding surface of the second outer region, is located in the direction along the outer edge of the circuit board, and is separated from the at least two projections by either the first outer fixed portion or the second outer fixed portion.

9. The electronic device according to claim 1, wherein the at least two projections include only two projections separating the first outer fixed portion from the second outer fixed portion in the direction along the outer edge of the circuit board.

10. The electronic device according to claim 1, wherein a distance between the first outer fixed portion and at least one of the at least two projections is less than a third of a wavelength of noise that the first member shields.

11. The electronic device according to claim 1, wherein a distance between the first outer fixed portion and at least one of the at least two projections is 20 mm or less.

12. The electronic device according to claim 4, wherein:

the second outer region further has a plurality of outer fixed portions and a plurality of projections that protrude from the surrounding surface of the second outer region, the plurality of outer fixed portions comprises the first outer fixed portion and the second outer fixed portion, the plurality of projections comprises the at least two projections located between the first outer fixed portion and the second outer fixed portion, two or less of the plurality of projections are formed between adjacent two of the plurality of outer fixed portions, the first inner region has a plurality of inner fixed portions as the at least one inner fixed portion, two or less of the inner contact portions are formed between adjacent two of the inner fixed portions as the at least one inner contact portion, the plurality of outer fixed portions and the plurality of projections from contact points between the first member and the second member, a plurality of the inner fixed portions and the two or less inner contact portions form contact points between the first member and the ground pattern, and a distance between every adjacent two of the contact points is:

less than a third of a wavelength of noise that one of the first member and the second member shields, or
  less than or equal to 20 mm.

13. The electronic device according to claim 2, wherein the first encompassing region has a first inner region in contact with a ground pattern formed on the first surface of the circuit board, and the second encompassing region has a second inner region in contact with a second ground pattern formed on the second surface of the circuit board.

14. The electronic device according to claim 13, wherein the first inner region has at least one first inner fixed portion fixed to the circuit board with a fixture, and at least one first contact portion being located away from the at least one first inner fixed portion in an extending direction of the first encompassing region and being in contact with the ground pattern via a projection, and the second inner region has at least one second inner fixed portion fixed to the circuit board with the fixture, and at least one second contact portion being located away from the at least one second inner fixed portion in an extending direction of the second encompassing region and being in contact with the ground pattern via a projection.

15. The electronic device according to claim 1, wherein the fasteners comprise screws.

16. The electronic device according to claim 1, wherein the first member comprises a first material having a first rigidity, wherein the second member comprises a second material having a second rigidity, wherein the first rigidity is less than the second rigidity.

* * * * *